United States Patent
Wu et al.

(10) Patent No.: US 11,367,641 B2
(45) Date of Patent: Jun. 21, 2022

(54) WAFER STORAGE DEVICE, CARRIER PLATE AND WAFER CASSETTE

(71) Applicant: Powertech Technology Inc., Hsinchu (TW)

(72) Inventors: Chin-Ta Wu, Hsinchu (TW); I-Lin Chan, Hsinchu (TW); Chi-Sheng Chang, Hsinchu (TW); Cheng-Hao Ciou, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 65 days.

(21) Appl. No.: 16/867,453

(22) Filed: May 5, 2020

(65) Prior Publication Data

US 2021/0193492 A1 Jun. 24, 2021

(30) Foreign Application Priority Data

Dec. 24, 2019 (TW) .................................. 108147450

(51) Int. Cl.
*H01L 21/673* (2006.01)
(52) U.S. Cl.
CPC .............................. *H01L 21/67379* (2013.01)
(58) Field of Classification Search
CPC . H01L 21/67379; H01L 21/67; H01L 21/673; H01L 21/6735; H01L 21/67359; H01L 21/6732; H01L 21/67369; H01L 21/67373; H01L 21/67383; H01L 21/67303; H01L 21/67313; H01L 21/67326; H01L 21/67309; H01L 21/6734; B65D 85/48; B65G 49/07
See application file for complete search history.

(56) References Cited

U.S. PATENT DOCUMENTS

| | | | | |
|---|---|---|---|---|
| 4,153,164 A | * | 5/1979 | Hofmeister | B65D 25/10 211/41.18 |
| 5,184,736 A | * | 2/1993 | Banker | A47B 57/34 211/40 |
| 5,392,932 A | * | 2/1995 | Vongfuangfoo | H01L 21/67333 206/724 |
| 5,445,486 A | * | 8/1995 | Kitayama | H01L 21/68707 414/416.03 |
| 5,472,099 A | * | 12/1995 | Terashima | H01L 21/6732 118/500 |

(Continued)

FOREIGN PATENT DOCUMENTS

| | | | | |
|---|---|---|---|---|
| EP | 0477897 A2 | * | 4/1992 | ....... H01L 21/67778 |
| WO | WO-9609787 A1 | * | 4/1996 | ....... H01L 21/67775 |

(Continued)

*Primary Examiner* — J. Gregory Pickett
*Assistant Examiner* — Abigail Elizabeth Guidry
(74) *Attorney, Agent, or Firm* — Burris Law, PLLC

(57) ABSTRACT

A wafer storage device includes a wafer cassette and a carrier plate. The wafer cassette includes a housing and a plurality pairs of retaining members disposed on lateral walls of the housing. The carrier plate is placed into the housing, is supported by one pair of the retaining members, and includes a plate body carrying the wafer thereon, and having a periphery formed with two slots extending respectively in two different radial directions of the wafer. Two positioning members respectively and radially correspond in position to the slots, and abut against an outer rim of the wafer.

20 Claims, 4 Drawing Sheets

(56) References Cited

U.S. PATENT DOCUMENTS

| | | | | |
|---|---|---|---|---|
| 5,579,925 A * | 12/1996 | Peng | ............... | G11B 33/0405 211/40 |
| 5,752,609 A * | 5/1998 | Kato | ............... | H01L 21/67309 211/41.18 |
| 5,797,487 A * | 8/1998 | Young | ............... | G11B 33/0405 206/307 |
| 5,820,686 A * | 10/1998 | Moore | ............... | C30B 31/12 118/730 |
| 6,287,112 B1 * | 9/2001 | Van Voorst Vader | ............... | C30B 31/14 118/728 |
| D451,660 S * | 12/2001 | Segerstrom | ............... | D6/407 |
| 6,976,585 B2 * | 12/2005 | Extrand | ............... | H01L 21/67366 206/454 |
| 7,077,912 B2 * | 7/2006 | Park | ............... | H01L 21/67309 118/725 |
| 7,484,958 B2 * | 2/2009 | Kobayashi | ............... | H01L 21/67309 432/258 |
| 7,661,544 B2 * | 2/2010 | Herzog | ............... | H01L 21/67309 211/41.18 |
| 8,230,806 B2 * | 7/2012 | Inoue | ............... | C23C 16/56 118/641 |
| 10,008,402 B1 * | 6/2018 | Ogitsu | ............... | H01L 21/68735 |
| 10,636,627 B2 * | 4/2020 | Kaneko | ............... | H01J 37/32779 |
| D924,823 S * | 7/2021 | Saiki | ............... | D13/182 |
| 2001/0043073 A1 * | 11/2001 | Montoya | ............... | G01R 1/07378 324/755.01 |
| 2002/0113027 A1 * | 8/2002 | Minami | ............... | H01L 21/67309 211/41.18 |
| 2002/0139698 A1 * | 10/2002 | Ku | ............... | G11B 33/0422 206/308.1 |
| 2003/0010673 A1 * | 1/2003 | Duban-Hu | ............... | H01L 21/67383 206/711 |
| 2003/0188978 A1 * | 10/2003 | Ku | ............... | G11B 33/0422 206/308.1 |
| 2006/0013674 A1 * | 1/2006 | Elliott | ............... | H01L 21/67775 414/222.01 |
| 2006/0213845 A1 * | 9/2006 | Utshig | ............... | G03B 42/04 211/41.13 |
| 2006/0249080 A1 * | 11/2006 | Zehavi | ............... | H01L 21/67309 118/725 |
| 2007/0170089 A1 * | 7/2007 | Burns | ............... | H01L 21/67379 206/711 |
| 2007/0284282 A1 * | 12/2007 | Yajima | ............... | H01L 21/67346 206/710 |
| 2009/0169346 A1 * | 7/2009 | Hamono | ............... | H01L 21/68707 414/225.01 |
| 2009/0321372 A1 * | 12/2009 | Gilmore | ............... | H01L 21/67309 211/41.18 |
| 2010/0038283 A1 * | 2/2010 | Chiu | ............... | H01L 21/67376 206/711 |
| 2011/0297329 A1 * | 12/2011 | Canale | ............... | H01L 21/67253 156/756 |
| 2011/0297579 A1 * | 12/2011 | Lu | ............... | H01L 21/67369 206/711 |
| 2012/0064734 A1 * | 3/2012 | Takahashi | ............... | H01L 21/6875 438/795 |
| 2012/0080150 A1 * | 4/2012 | Riege | ............... | H01L 21/67092 156/752 |
| 2012/0322239 A1 * | 12/2012 | Singh | ............... | B23K 26/36 438/462 |
| 2014/0251209 A1 * | 9/2014 | Obu | ............... | H01L 21/67303 118/500 |
| 2015/0022821 A1 * | 1/2015 | Mazzocco | ............... | H01L 21/67259 356/601 |
| 2015/0041360 A1 * | 2/2015 | Watson | ............... | H01L 21/67393 206/711 |
| 2015/0294887 A1 * | 10/2015 | Burns | ............... | H01L 21/67389 206/711 |
| 2015/0380293 A1 * | 12/2015 | Nishijima | ............... | H01L 21/6836 206/710 |
| 2016/0033205 A1 * | 2/2016 | Bera | ............... | F28F 3/12 165/166 |
| 2016/0093487 A1 * | 3/2016 | Huussen | ............... | C23C 16/45523 438/758 |
| 2018/0033662 A1 * | 2/2018 | Wenger | ............... | H01L 21/67386 |
| 2018/0277411 A1 * | 9/2018 | Choi | ............... | H01L 21/67757 |
| 2019/0287832 A1 * | 9/2019 | Vaughan | ............... | C23C 16/4583 |
| 2021/0296149 A1 * | 9/2021 | Green | ............... | H01L 21/67383 |

FOREIGN PATENT DOCUMENTS

| | | | | |
|---|---|---|---|---|
| WO | WO-0019502 A1 * | 4/2000 | ............... | C30B 31/14 |
| WO | WO-02079053 A1 * | 10/2002 | ............... | H01L 21/6732 |
| WO | WO-2007099786 A1 * | 9/2007 | ............... | H01L 21/67309 |
| WO | WO-2009020243 A1 * | 2/2009 | ............... | H01L 21/67132 |
| WO | WO-2011132553 A1 * | 10/2011 | ............... | H01L 21/67379 |
| WO | WO-2011156292 A2 * | 12/2011 | ............... | H01L 21/6838 |

* cited by examiner

WAFER STORAGE DEVICE, CARRIER PLATE AND WAFER CASSETTE

CROSS-REFERENCE TO RELATED APPLICATION

This application claims priority of Taiwanese Invention Patent Application No. 108147450, filed on Dec. 24, 2019.

FIELD

The disclosure relates to a wafer storage device, more particularly to a wafer storage device including a wafer positioning unit.

BACKGROUND

In a semiconductor device manufacturing process, a semiconductor wafer (hereinafter referred to as a wafer) being adhered on a dicing tape is processed with laser light by, for example, stealth dicing technology. Then, the processed wafer is disposed on a carrier plate that is to be stored in a wafer cassette so as to be transported for subsequent processing.

Referring to FIG. 1, a conventional wafer storage device includes a plurality of carrier plates 11 and a wafer cassette 12 defining a space for receiving the carrier plates 11 therein. Each of the carrier plate 11 is for carrying a wafer 10 processed by the stealth dicing technology thereon and includes a plate body 111, two lateral positioning portions 112 disposed respectively at two lateral sides of the plate body 111, and a rear positioning portion 113 disposed at a rear end of the plate body 111 to prevent the wafer 10 disposed on the carrier plate 11 from falling off. Generally, for ease of accessing the wafer 10, the carrier plate 11 is designed to have a size larger than that of the wafer 10. As such, a distance (G) between each of the lateral positioning portions 112 and the wafer 10 is relatively large, so that the wafer 100 may be moved relative to the carrier plate 11 when the carrier plate 11 is moved into and out of the space or the storage device is transported.

SUMMARY

Therefore, an object of the disclosure is to provide a wafer storage device that can alleviate the drawback of the prior art.

According to one aspect of the disclosure, a wafer storage device including a wafer cassette and at least one carrier plate is provided. The wafer cassette includes a housing and a plurality pairs of retaining members. The housing defines a receiving space having a front opening through which a wafer is movable into and out of the receiving space in a first direction. The housing includes two lateral walls opposite to each other in a second direction transverse to the first direction. The plurality pairs of retaining members are spaced apart from one another in a third direction transverse to the first direction and the second direction. Each pair of the retaining members are disposed respectively on the lateral walls and correspond in position to each other in the second direction. The carrier plate is placed into the receiving space through the front opening, is supported by one pair of the retaining members, and includes a plate body having a carrying surface and an outer periphery, and a positioning unit. The carrying surface is adapted to carry the wafer thereon. The outer periphery is formed with two slots extending respectively in two different radial directions of the wafer. The positioning unit includes two positioning members extending substantially in the third direction, respectively and radially corresponding in position to the slots, and adapted to abut against an outer rim of the wafer.

According to another aspect of the disclosure, a carrier plate adapted to carry a wafer and disposed in a wafer cassette is provided. The wafer cassette includes a housing and a plurality pairs of retaining members. The housing defines a receiving space having a front opening through which the carrier plate is placed into the receiving space in a first direction, and includes two lateral walls opposite to each other in a second direction transverse to the first direction. The plurality pairs of retaining members are spaced apart from one another in an third direction transverse to the first direction and the second direction. Each pair of the retaining members are disposed respectively on the lateral walls and correspond to each other in the second direction. The carrier plate is adapted to be disposed in the receiving space, is adapted to be supported by one pair of the retaining members, and includes a plate body and a positioning unit. The plate body has a carrying surface adapted to carry the wafer thereon, is formed with two slots angularly spaced apart from each other, and extending respectively in two different radial directions of the wafer. The positioning unit is adapted to prevent the wafer from falling off the carrier plate and includes two positioning members extending substantially in the third direction, respectively corresponding in position to the slots and adapted to abut against an outer rim of the wafer.

According to still another one aspect of the disclosure, a wafer cassette for receiving a carrier plate carrying a wafer therein is provided. The carrier plate includes a plate body having a carrying surface for carrying the wafer thereon, and formed with two slots angularly spaced apart from each other and extending respectively in two radial directions of the wafer. The wafer cassette includes a housing, a plurality pairs of retaining members and a positioning unit. The housing defines a receiving space that has a front opening through which the carrier plate carrying the wafer is placed into the receiving space in a first direction, and includes two lateral walls that are opposite to each other in a second direction transverse to the first direction. The plurality pairs of retaining members are spaced apart from one another in a third direction transverse to the first direction and the second direction. Each pair of the retaining members are disposed respectively on the lateral walls and correspond in position to each other in the second direction. The positioning unit includes two positioning members extending in the third direction through the slots, respectively, and adapted to abut against an outer rim of the wafer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
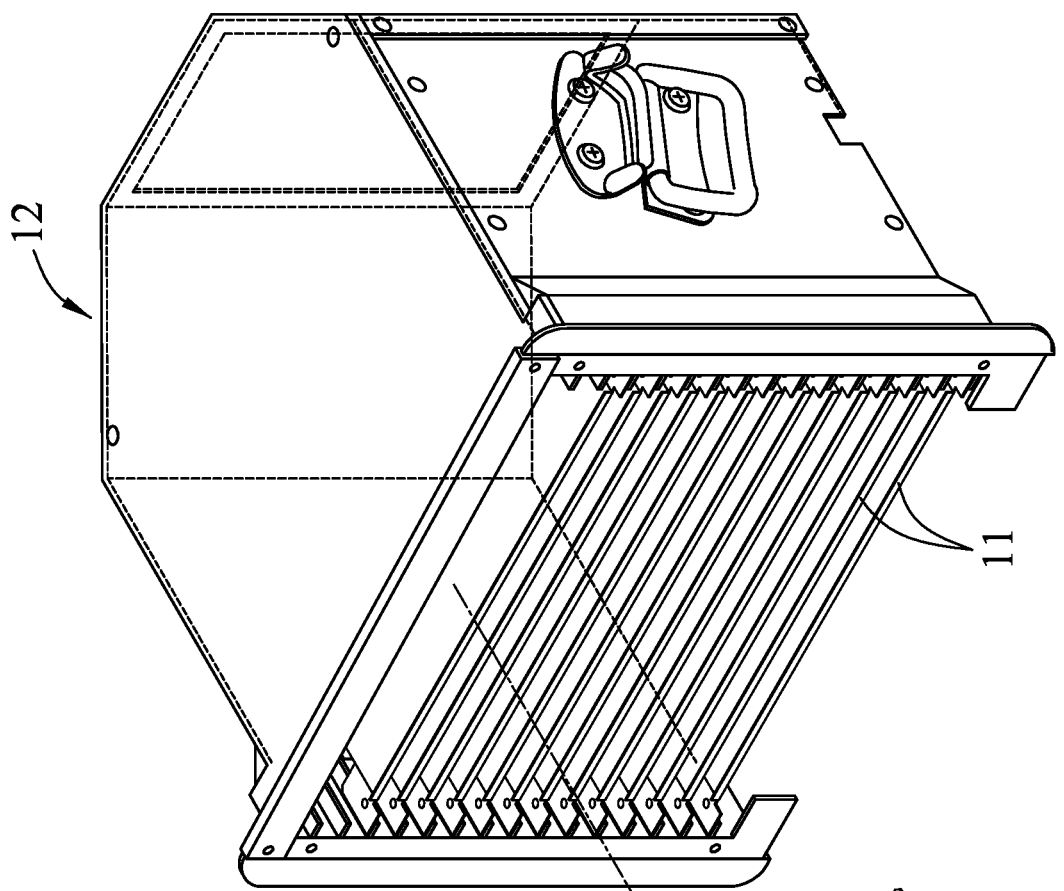
FIG. 1 is a perspective view of a conventional wafer storage device.
Figure 1:
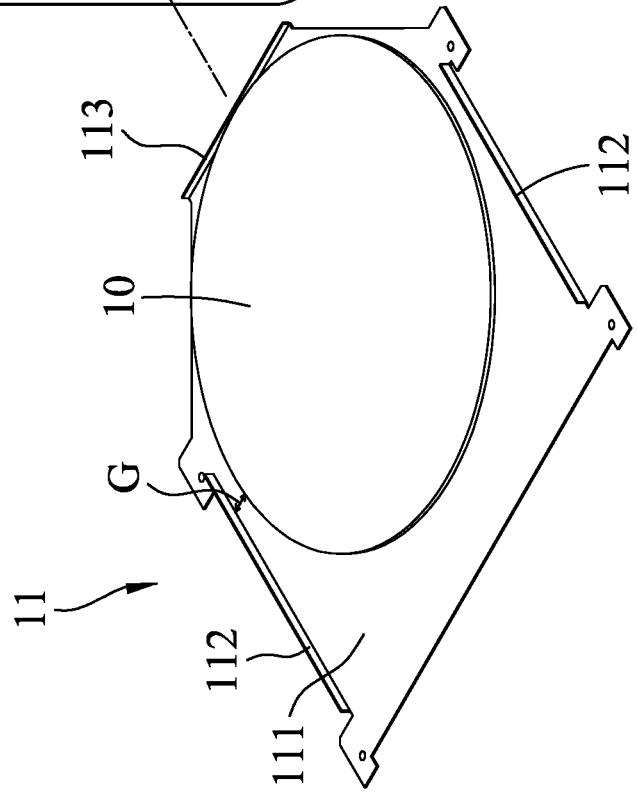

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
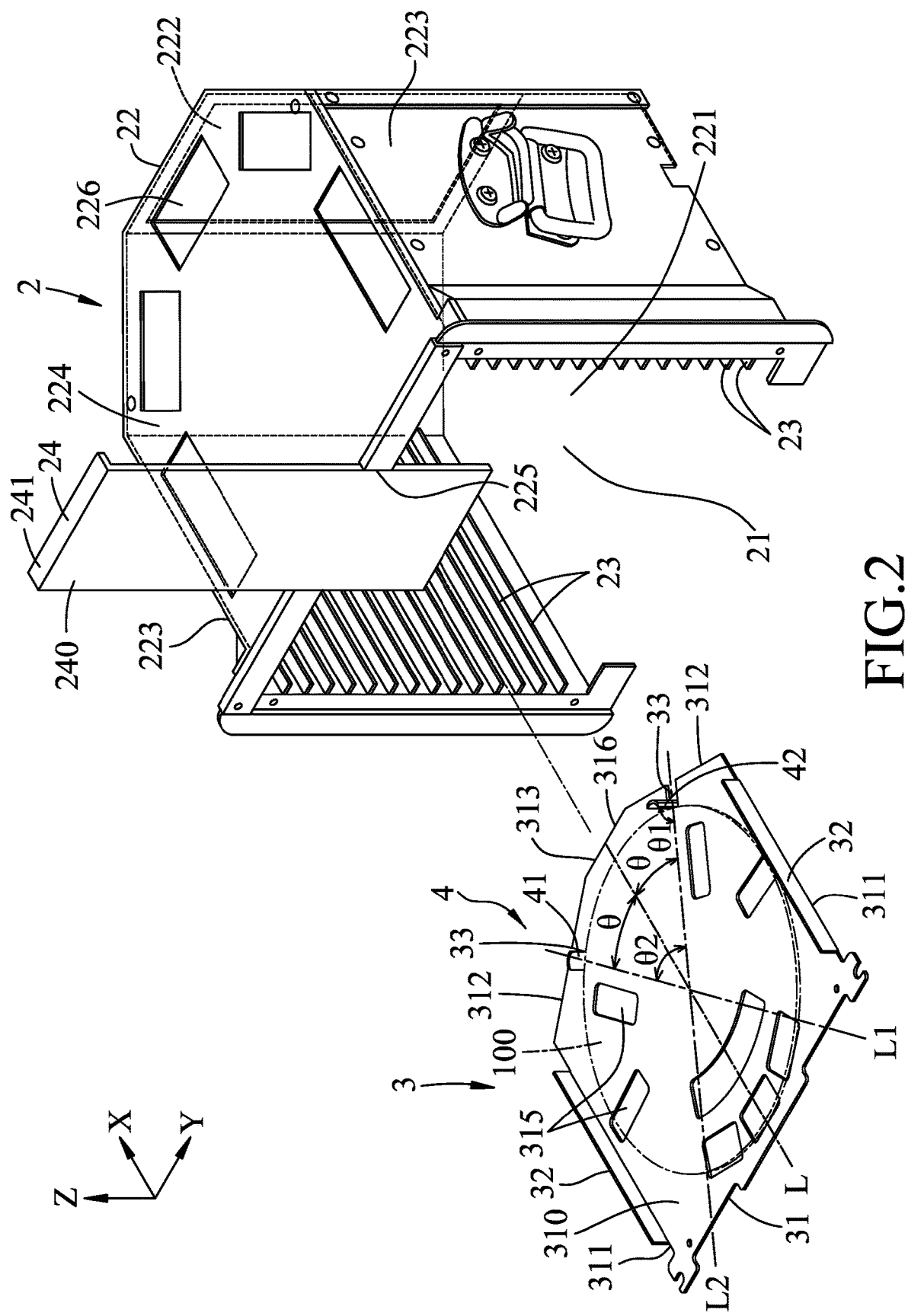
FIG. 2 is a schematic perspective view of a first embodiment according to a wafer storage device of the present disclosure.

Referring to FIG. 2, a first embodiment of a wafer storage device according to the present disclosure is shown. The wafer storage device includes a wafer cassette 2 and a carrier plate 3.

The wafer cassette 2 includes a housing 22, a plurality pairs of retaining members 23, and a cover plate 24. The housing 22 defines a receiving space 21 having a front opening 221 through which a wafer 100 is movable into and out of the receiving space 21 in a first direction (X) and a rear opening 222 opposite to the front opening 221 in the first direction (X). The housing 22 includes two lateral walls 223 and a top wall 224. The lateral walls 223 are opposite to each other in a second direction (Y) transverse to the first direction (X). The top wall 224 interconnects top ends of the lateral walls 223, and is formed with a guiding groove 225 in spatial communication with the front opening 221.

The cover plate 24 removably extends through the guiding groove 225 in a third direction (Z) transverse to the first direction (X) and the second direction (Y) and covers a portion of the front opening 221 so as to prevent the wafer 100 from falling out of the receiving space 21 through the front opening 221. In this embodiment, the cover plate 24 includes a vertical plate portion 240 and a horizontal flange portion 241 extending from a top end of the vertical plate portion 240 so as to position the cover plate 24 on the top wall 224.

Any one of the lateral walls 223 and the top wall 224 may be formed with at least one opening 226 in spatial communication with the receiving space 221 and the ambient surroundings so as to allow an robotic arm (not shown) to move into the receiving space 221 through the opening 226 so as to move the wafer 100 to a desired position for subsequent processing. As shown in FIG. 2, in this embodiment, the top wall 224 is formed with one opening 226 allowing the wafer 100 to be moved. Note that the main feature of the present disclosure does not resides in the number and the position of the opening 226 and the opening 226 may be omitted in some embodiments.

The plurality pairs of retaining members 23 are spaced apart from one another in the third direction (Z). Each pair of the retaining members 23 are disposed respectively on the lateral walls 223 and correspond in position to each other in the second direction (Y).

The carrier plate 3 is placed into the receiving space 21 through the front opening 221, is supported by one pair of the retaining members 23, and includes a plate body 31 and a positioning unit 4. Note that the wafer storage device may include a plurality of the carrier plates 3 supported by different pairs of the retaining members 23 and the number of the carrier plate 3 is not limited to the example described herein.

The plate body 31 of the carrier plate 3 has a carrying surface 310, two lateral edges 311, a rear edge 313, and two slots 33.

In this embodiment, the plate body 31 is formed with a plurality of through holes 315 extending therethrough such that the weight of the plate body 31 can be reduced. The carrying surface 310 is adapted to carry the wafer 100 thereon. The lateral edges 311 respectively correspond in position to the lateral walls 223 of the housing 22. The rear edge 313 is disposed adjacent to the rear opening 222 of the housing 2 and opposite to the front opening 221 in the first direction (X), and includes two inclined edge portions 312 and an interconnecting edge portion 316. The inclined edge portions 312 are inclined relative to the first direction (X) and are connected respectively to the lateral edges 311. The interconnecting edge portion 316 extends along the second direction (Y) and interconnects the inclined edge portions 312. Note that a distance between the lateral edges 311 in the second direction (Y) is slightly greater than the diameter of the wafer 100, and the carrier plate 3 further includes two ribs 32 extending respectively from the lateral edges 311 in the third direction (Z) to prevent the wafer 100 disposed thereon from falling off from the lateral edges 311. Note that the configuration of each of the ribs 32 is not limited to the example described herein, and can be modified to be a plurality spaced-apart elements arranged in the first direction (X).

In this embodiment, the slots 33 are formed respectively in the inclined edge portions 312 and extend respectively in two different radial directions (R1, R2) of the wafer 100. That is, the slots 33 are formed in an outer periphery of the plate body 31. Specifically, the slots 33 are formed symmetrically in the plate body 31 with respect to a horizontal line (L) extending through a center (O) of the wafer 100 in the first direction (X) such that a first included angle (θ) defined between the horizontal line (L) and a central line (L1) of one of the slots 33 is the same as a second included angle (θ) defined between the horizontal line (L) and a central line (L2) of the other one of the slots 33. Further, an included angle (θ2) defined between the central lines (L1, L2) of the slots 33 is larger than 20 degrees and is smaller than 180 degrees.

Figure 3:
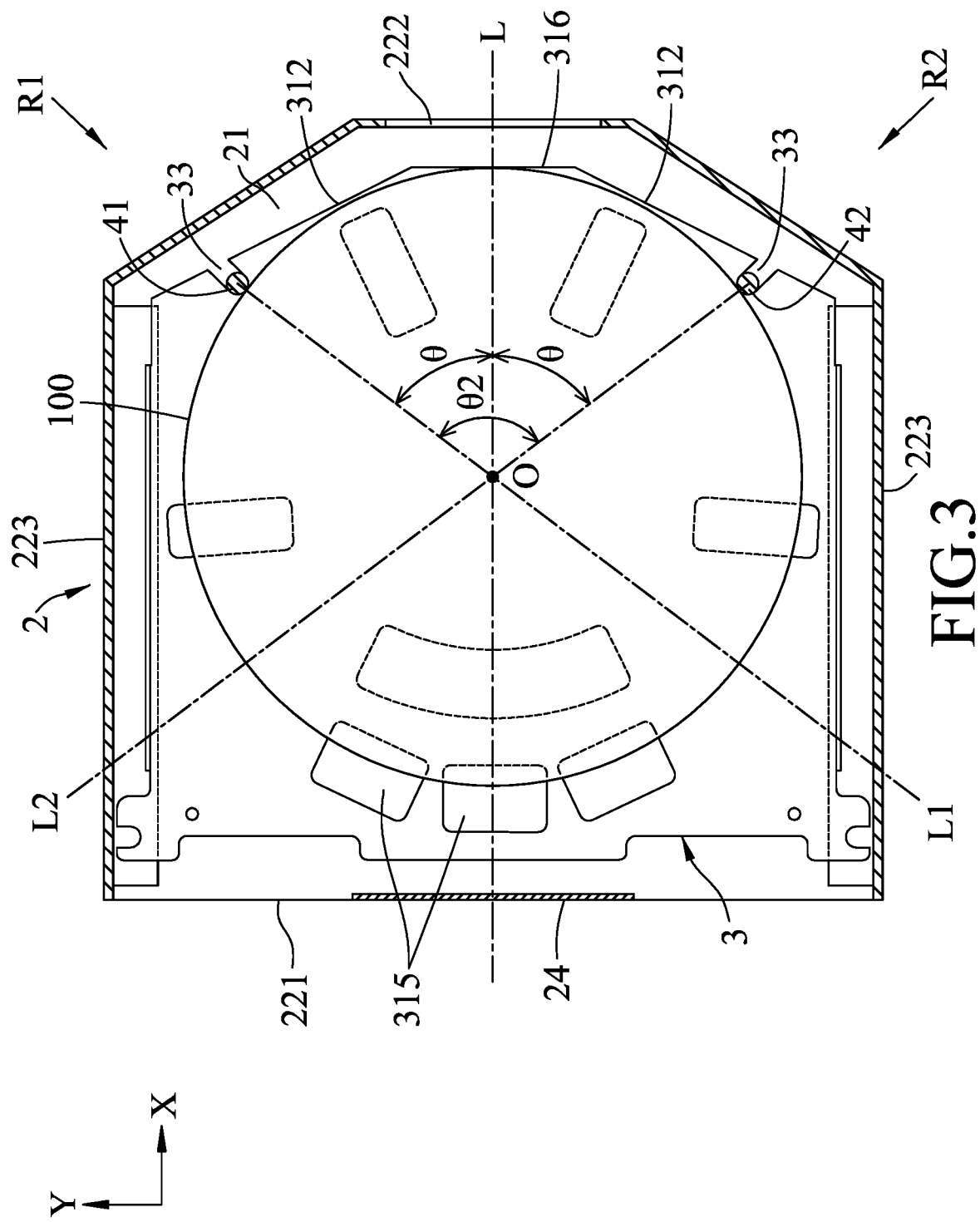
FIG. 3 is a schematic top view of a modified carrier plate of the first embodiment of the wafer storage device.

The positioning unit 4 includes two positioning members 41, 42 extending substantially in the third direction (Z), respectively and radially corresponding in position to the slots 33, and adapted to abut against an outer rim of the wafer 100 to prevent the wafer 100 from falling off the carrier plate 31. The positioning members 41, 42 extend upwardly from the carrying surface 310, and define inner ends of the slots 33, respectively. In this embodiment, the positioning members 41, 42 are formed on the carrier plate 31 by pressing, and are complementary in shape to the slots 33, respectively. Alternatively, as shown in FIG. 3, the positioning members 41, 42 may be cylindrical pillars extending through the slots 33, respectively.

Referring back to FIG. 2, an included angle (θ1) defined between each of the positioning members 41, 42 and the carrying surface 310 ranges from 90 degrees to 110 degrees. By virtue of the configurations of the positioning members 41, 42, it is relatively convenient to remove the wafer 100 from the carrier plate 3. Additionally, as compared to the conventional wafer storage device, since the outer rim of the wafer 100 abuts against the positioning members 41, 42, movement of the wafer 100 relative to the carrier plate 3 can be prevented.

Figure 4:
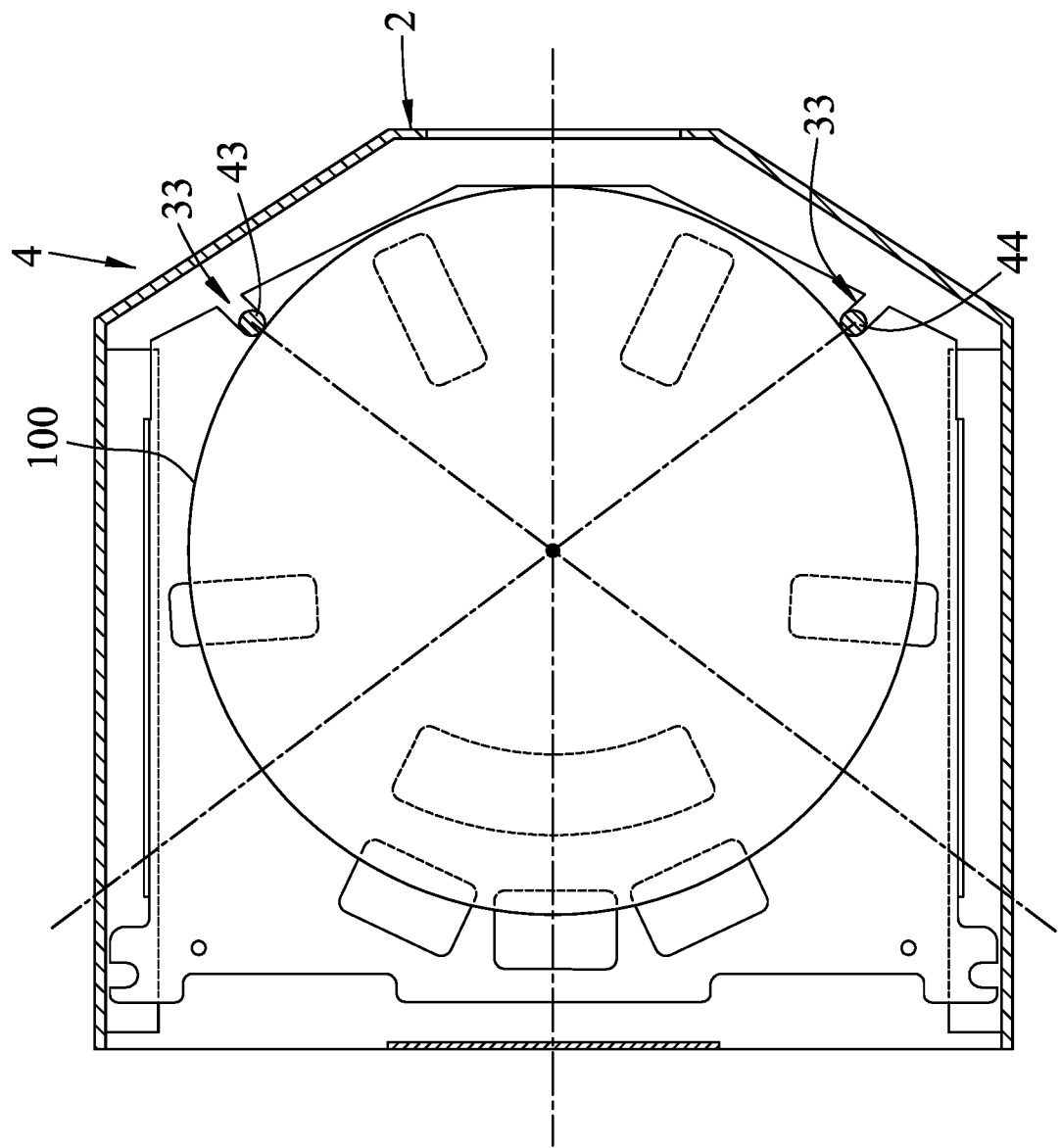
FIG. 4 is a schematic top view of a carrier plate and a positioning unit of a second embodiment according to the wafer storage device of the present disclosure.

Referring to FIG. 4, a top view of a wafer storage device according to a second embodiment of the present disclosure is shown. The second embodiment is similar to the first embodiment and the differences between the first and second embodiments reside in the following. In the second embodiment, the positioning unit 4 includes two positioning members 43, 44 extend in the third direction (Z) from the top wall 224 of the housing 22 into the receiving space 21 and through the slots 33, respectively, and abut against the outer rim of the wafer 100, so as to prevent the wafer 100 from falling off the carrier plate 3. In this embodiment, each of the positioning members 43, 44 is configured as a cylindrical pillar.

To sum up, by virtue of the slots 33 formed respectively in the inclined edge portions 312 of the carrier plate 3 the outer rim of the wafer 100 are movable into contact with the positioning members 41, 42, 43, 44 so as to be positioned on the carrier plate 3. Thus, wearing of the wafer 100 can be reduced and falling of the wafer 100 from the carrier plate 3 can be prevented when the wafer storage device is transported or the carrier plate 3 is moved into or out of the receiving space 21 of the housing 22.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A wafer storage device comprising:
    a wafer cassette including
        a housing that defines a receiving space having a front opening through which a wafer is movable into and out of said receiving space in a first direction and that includes two lateral walls opposite to each other in a second direction transverse to the first direction, and
        a plurality pairs of retaining members that are spaced apart from one another in a third direction transverse to the first direction and the second direction, each pair of said retaining members being disposed respectively on said lateral walls and corresponding in position to each other in the second direction; and
    at least one carrier plate placed into said receiving space through said front opening, supported by one pair of said retaining members, and including a plate body having a carrying surface that is adapted to carry the wafer thereon, an outer periphery that is formed with two slots extending respectively in two different radial directions of the wafer, and a positioning unit including two positioning members extending substantially in the third direction, respectively and radially corresponding in position to said slots, adapted to abut against an outer rim of the wafer to prevent the wafer from falling off said carrier plate, and defining inner ends of said slots, respectively.

2. The wafer storage device as claimed in claim 1, wherein said positioning members are formed on said at least one carrier plate, and are complementary in shape to said slots, respectively.

3. The wafer storage device as claimed in claim 1, wherein said plate body has a rear edge disposed opposite to said front opening of said housing in the first direction and including two inclined edge portions that are inclined relative to the first direction and an interconnecting edge portion that extends along the second direction and that interconnects said inclined edge portions, said slots being formed respectively in said inclined edge portions.

4. The wafer storage device as claimed in claim 1, wherein said positioning members extend upwardly from said carrying surface, and through said slots, respectively.

5. The wafer storage device as claimed in claim 4, wherein an included angle defined between each of said positioning members and said carrying surface ranges from 90 degrees to 110 degrees.

6. The wafer storage device as claimed in claim 1, wherein said slots are formed symmetrically in said plate body with respect to a horizontal line extending through a center of the wafer in the first direction such that a first included angle defined between the horizontal line and a central line of one of said slots is the same as a second included angle defined between the horizontal line and a central line of the other one of said slots.

7. The wafer storage device as claimed in claim 1, wherein an included angle defined between central lines of said slots is larger than 20 degrees and is smaller than 180 degrees.

8. The wafer storage device as claimed in claim 1, wherein said housing further includes a top wall interconnecting top ends of said lateral walls and formed with a guiding groove in spatial communication with said front opening, said wafer cassette further including a cover plate removably extending through said guiding groove in the third direction and covering a portion of said front opening so as to prevent the wafer from falling out of said receiving space through said front opening.

9. A carrier plate adapted to carry a wafer and disposed in a wafer cassette, the wafer cassette including a housing that defines a receiving space having a front opening through which said carrier plate is placed into the receiving space in a first direction, and that includes two lateral walls opposite to each other in a second direction transverse to the first direction, and a plurality pairs of retaining members that are spaced apart from one another in an third direction transverse to the first direction and the second direction, each pair of the retaining members being disposed respectively on the lateral walls and corresponding to each other in the second direction, said carrier plate being adapted to be supported by one pair of the retaining members, and comprising:
    a plate body having a carrying surface adapted to carry the wafer thereon and an outer periphery formed with two slots that are angularly spaced apart from each other, and that extend respectively in two different radial directions of the wafer; and
    a positioning unit adapted to prevent the wafer from falling off said carrier plate and including two positioning members extending substantially in the third direction, respectively and radially corresponding in position to said slots, adapted to abut against an outer rim of the wafer to prevent the wafer from falling off said carrier plate, and defining inner ends of said slots, respectively.

10. The carrier plate as claimed in claim 9, wherein said positioning members are complementary in shape to said slots, respectively.

11. The carrier plate as claimed in claim 9, wherein said plate body has a rear edge disposed opposite to said front opening of said housing in the first direction and including two inclined edge portions that are inclined relative to the first direction and an interconnecting edge portion that extends along the second direction and that interconnects said inclined edge portions, said slots being formed respectively in said inclined edge portions.

12. The carrier plate as claimed in claim 9, wherein said positioning members are formed on said plate body and protrude away from said carrying surface upwardly.

13. The carrier plate as claimed in claim 12, wherein an included angle defined between each of said positioning members and said carrying surface ranges from 90 degrees to 110 degrees.

14. The carrier plate as claimed in claim 9, wherein said slots are formed symmetrically in said plate body with respect to a horizontal line extending through a center of the wafer in the first direction such that a first included angle defined between the horizontal line and a central line of one of said slots is the same as a second included angle defined between the horizontal line and a central line of the other one of said slots.

15. The carrier plate as claimed in claim 9, wherein an included angle defined between central lines of said slots is larger than 20 degrees and is smaller than 180 degrees.

16. A wafer cassette for receiving a carrier plate carrying a wafer therein, the carrier plate including a plate body having a carrying surface for carrying the wafer thereon, and formed with two slots angularly spaced apart from each other and extending respectively in two radial directions of the wafer, said wafer cassette comprising:
 a housing defining a receiving space that has a front opening through which the carrier plate carrying the wafer is placed into said receiving space in a first direction, and including
 two lateral walls that are opposite to each other in a second direction transverse to the first direction, and
 a plurality pairs of retaining members spaced apart from one another in a third direction transverse to the first direction and the second direction, each pair of said retaining members being disposed respectively on said lateral walls and corresponding in position to each other in the second direction; and
 a positioning unit that includes two positioning members extending in the third direction through said slots, respectively, and adapted to abut against an outer rim of the wafer, so as to prevent the wafer from falling off the carrier plate.

17. The wafer cassette as claimed in claim 16, wherein said housing of said wafer cassette further includes a top wall that interconnects top ends of said lateral walls, said positioning members extending from said top wall of said housing into said receiving space in the third direction.

18. The wafer cassette as claimed in claim 16, wherein said housing of said wafer cassette further includes a top wall that interconnects said lateral walls and that is formed with a guiding groove in spatial communication with said front opening, said wafer cassette further including a cover plate removably extending through said guiding groove in the third direction and covering a portion of said front opening so as to prevent the wafer and the carrier plate from falling out of said receiving space through said front opening.

19. The wafer cassette as claimed in claim 18, wherein said cover plate includes a vertical plate portion and a horizontal flange portion extending from a top end of said vertical plate portion of said cover plate, so as to position said cover plate on said top wall.

20. The wafer cassette as claimed in claim 18, said top wall is formed with at least one opening in spatial communication with said receiving space and the ambient surroundings.

\* \* \* \* \*